(12) United States Patent
Tsutsumi et al.

(10) Patent No.: US 9,184,492 B2
(45) Date of Patent: Nov. 10, 2015

(54) RADIO DEVICE

(75) Inventors: Yukako Tsutsumi, Kanagawa-ken (JP); Hiroki Shoki, Tokyo (JP); Shuichi Obayashi, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 66 days.

(21) Appl. No.: 13/178,967

(22) Filed: Jul. 8, 2011

(65) Prior Publication Data

US 2012/0075147 A1    Mar. 29, 2012

(30) Foreign Application Priority Data

Sep. 24, 2010   (JP) ................................. 2010-213969

(51) Int. Cl.
*H01Q 1/38* (2006.01)
*H01Q 1/22* (2006.01)
*H01Q 23/00* (2006.01)

(52) U.S. Cl.
CPC ............. *H01Q 1/2283* (2013.01); *H01Q 23/00* (2013.01); *H01L 2224/16225* (2013.01); *H01L 2224/32225* (2013.01); *H01L 2224/73204* (2013.01)

(58) Field of Classification Search
USPC .................................. 343/702, 700 MS, 851
See application file for complete search history.

(56) References Cited

U.S. PATENT DOCUMENTS

| | | |
|---|---|---|
| 2,283,914 A | 5/1942 | Carter |
| 5,276,455 A | 1/1994 | Fitzsimmons et al. |
| 5,422,650 A | 6/1995 | Hill |
| 5,488,380 A | 1/1996 | Harvey et al. |
| 5,682,143 A | 10/1997 | Brady et al. |
| 5,786,626 A | 7/1998 | Brady et al. |
| 5,972,156 A | 10/1999 | Brady et al. |
| 6,078,259 A | 6/2000 | Brady et al. |

(Continued)

FOREIGN PATENT DOCUMENTS

| | | |
|---|---|---|
| JP | 5-327329 A | 12/1993 |
| JP | 8-088581 A | 4/1996 |

(Continued)

OTHER PUBLICATIONS

U.S. Appl. No. 13/344,848; First Named Inventor: Yukako Tsutsumi; Title: "Wireless Apparatus and Wireless System"; Filed: Jan. 6, 2012.

(Continued)

*Primary Examiner* — Hoang V Nguyen
*Assistant Examiner* — Hai Tran
(74) *Attorney, Agent, or Firm* — Holtz, Holtz, Goodman & Chick PC

(57) ABSTRACT

According to one embodiment, a radio device includes: a mounting board having a conductive plane; a semiconductor package mounted on the mounting board and having a interposer having a conductive plane, a semiconductor chip mounted on one surface of the interposer, and an antenna having a conductive element formed on the one surface and connected to the semiconductor chip; and a plurality of connection portions connecting the mounting board and the interposer. A first electrical length of the first connection portion which is nearest the conductive element among the plurality of connection portions or a second electrical length of the first connection portion including a conductive plane of the mounting board or interposer connected to the first connection portion is less than ½ wavelength of the operating frequency of the antenna.

22 Claims, 14 Drawing Sheets

(56) References Cited

U.S. PATENT DOCUMENTS

| | | | |
|---|---|---|---|
| 6,137,453 | A | 10/2000 | Wang et al. |
| 6,249,242 | B1 | 6/2001 | Sekine et al. |
| 6,271,793 | B1 | 8/2001 | Brady et al. |
| 6,662,430 | B2 | 12/2003 | Brady et al. |
| 6,717,544 | B2 | 4/2004 | Nagasaku et al. |
| 6,770,955 | B1 * | 8/2004 | Coccioli et al. ............... 257/659 |
| 6,833,806 | B2 | 12/2004 | Nagasaku et al. |
| 6,906,677 | B2 | 6/2005 | Yamamoto et al. |
| 7,154,432 | B2 | 12/2006 | Nagasaku et al. |
| 7,295,161 | B2 | 11/2007 | Gaucher et al. |
| 7,329,950 | B2 | 2/2008 | Khorram |
| 7,382,331 | B2 | 6/2008 | Kurashima et al. |
| 7,518,221 | B2 | 4/2009 | Gaucher et al. |
| 7,545,329 | B2 | 6/2009 | Gaucher et al. |
| 7,559,131 | B2 | 7/2009 | Credelle et al. |
| 7,580,001 | B2 * | 8/2009 | Tsai et al. ..................... 343/819 |
| 7,586,193 | B2 | 9/2009 | Weste |
| 7,619,529 | B2 | 11/2009 | Goff et al. |
| 7,768,456 | B2 * | 8/2010 | Tsutsumi et al. ...... 343/700 MS |
| 7,782,624 | B2 | 8/2010 | Fujii |
| 8,123,131 | B2 | 2/2012 | Sawachi |
| 8,330,259 | B2 | 12/2012 | Soler Castany et al. |
| 2005/0169544 | A1 | 8/2005 | Clark |
| 2006/0033664 | A1 | 2/2006 | Soler Castany et al. |
| 2006/0151614 | A1 | 7/2006 | Nishizawa et al. |
| 2006/0256018 | A1 | 11/2006 | Soler Castany et al. |
| 2007/0120742 | A1 | 5/2007 | Soler Castany et al. |
| 2007/0194427 | A1 * | 8/2007 | Choi et al. ..................... 257/686 |
| 2007/0200708 | A1 | 8/2007 | Hayama et al. |
| 2007/0273600 | A1 | 11/2007 | Tsujimura et al. |
| 2008/0158091 | A1 * | 7/2008 | Imaoka et al. ................ 343/851 |
| 2008/0158094 | A1 | 7/2008 | Rofougaran |
| 2008/0231518 | A1 | 9/2008 | Tsutsumi et al. |
| 2009/0085810 | A1 | 4/2009 | Soler Castany et al. |
| 2011/0309893 | A1 | 12/2011 | Kawamura et al. |
| 2012/0193810 | A1 | 8/2012 | Tsutsumi et al. |
| 2012/0249380 | A1 | 10/2012 | Soler Castany et al. |
| 2012/0319913 | A1 | 12/2012 | Tsutsumi et al. |
| 2013/0016015 | A1 | 1/2013 | Tsutsumi |
| 2013/0016029 | A1 | 1/2013 | Tsutsumi |

FOREIGN PATENT DOCUMENTS

| | | | |
|---|---|---|---|
| JP | 8-213419 | A | 8/1996 |
| JP | 10-013296 | A | 1/1998 |
| JP | 11-261456 | A | 9/1999 |
| JP | 2000-174543 | A | 6/2000 |
| JP | 2001-196824 | A | 7/2001 |
| JP | 2001-203519 | A | 7/2001 |
| JP | 2001196829 | A | 7/2001 |
| JP | 2005-228226 | A | 8/2005 |
| JP | 2006-505973 | A | 2/2006 |
| JP | 2007-267217 | A | 10/2007 |
| JP | 2007-300266 | | 11/2007 |
| JP | 2007-312354 | A | 11/2007 |
| JP | 2008-028691 | A | 2/2008 |
| JP | 2008-035033 | A | 2/2008 |
| JP | 2008-141215 | A | 6/2008 |
| JP | 2008131215 | A | 6/2008 |
| JP | 2008-167036 | A | 7/2008 |
| JP | 4121860 | B2 | 7/2008 |
| JP | 2008160949 | A | 7/2008 |
| JP | 2008-259250 | A | 10/2008 |
| JP | 2010-021456 | A | 1/2010 |
| JP | 2010-109466 | A | 5/2010 |
| JP | 2010-183055 | A | 8/2010 |
| JP | 4523223 | B2 | 8/2010 |
| JP | 2011-130254 | A | 6/2011 |
| WO | WO 96/13793 | A1 | 5/1996 |
| WO | WO 2004/042868 | A1 | 5/2004 |

OTHER PUBLICATIONS

U.S. Appl. No. 13/477,464; First Named Inventor: Yukako Tsutsumi; Title: "Wireless Apparatus"; Filed: May 22, 2012.
U.S. Appl. No. 13/542,149; First Named Inventor: Yukako Tsutsumi; Filed: Jul. 5, 2012; Title: "Antenna Device and Wireless Apparatus".
Japanese Office Action dated Aug. 28, 2012 (and English translation thereof) in counterpart Japanese Application No. 2010-213969.
U.S. Appl. No. 13/447,676: First Named Inventor: Yukako Tsutsumi: Title: "Wireless Apparatus": Filed: Apr. 16, 2012.
U.S. Appl. No. 13/782,552; First Named Inventor: Yukako Tsutsumi; Title: "Wireless Device"; Filed: Mar. 1, 2013.

* cited by examiner (a)

(b)

(a)

(b)

RADIO DEVICE

CROSS-REFERENCE TO RELATED APPLICATION

This application is based upon and claims the benefit of priority from the prior Japanese Patent Application No. 2010-213969 filed on Sep. 24, 2010, the entire contents of which are incorporated herein by reference.

FIELD

Embodiments described herein relate generally to a radio device.

BACKGROUND

There is known a technique in which an antenna is incorporated in a semiconductor package in which a radio circuit is mounted in order to achieve a size reduction of a radio device. For example, among semiconductor packages in which an antenna is mounted in an interposer so as to incorporate an antenna, there is one in which a conductive material does not exist in at least 50% of the antenna mounting area of the interposer. With the configuration in which a conductive material is not provided near the antenna, degradation in antenna characteristics can be suppressed.

In the case where a semiconductor package is mounted in a radio device, an integrated circuit package is mounted on a mounting board. Like the interposer, the mounting board includes conductive materials such as wiring and ground. As a method for connecting the mounting board and semiconductor package, there is known a BGA (mall grid array) method that connects them using a solder ball.

Even in the case where a configuration in which the conductive material is absent only in a part of the interposer is adopted, when a semiconductor package is mounted on the radio device, conductive materials such as wiring and solder balls are inevitably arranged near the antenna, which may result in degradation in the antenna characteristics.

DETAILED DESCRIPTION

According to one embodiment, a radio device includes: a mounting board having a conductive plane; a semiconductor package mounted on the mounting board and having an interposer having a conductive plane, a semiconductor chip mounted on one surface of the interposer, and an antenna having a conductive element formed on the one surface of the interposer and connected to the semiconductor chip; and a plurality of connection portions connecting the mounting board and the interposer. A first electrical length of the first connection portion which is nearest the conductive element among the plurality of connection portions or a second electrical length of the first connection portion including a conductive plane of the mounting board or the interposer connected to the first connection portion is less than ½ wavelength of the operating frequency of the antenna.

Hereinafter, embodiments of the present invention will be described with reference to the accompanying drawings.

First Embodiment

Figure 1A:
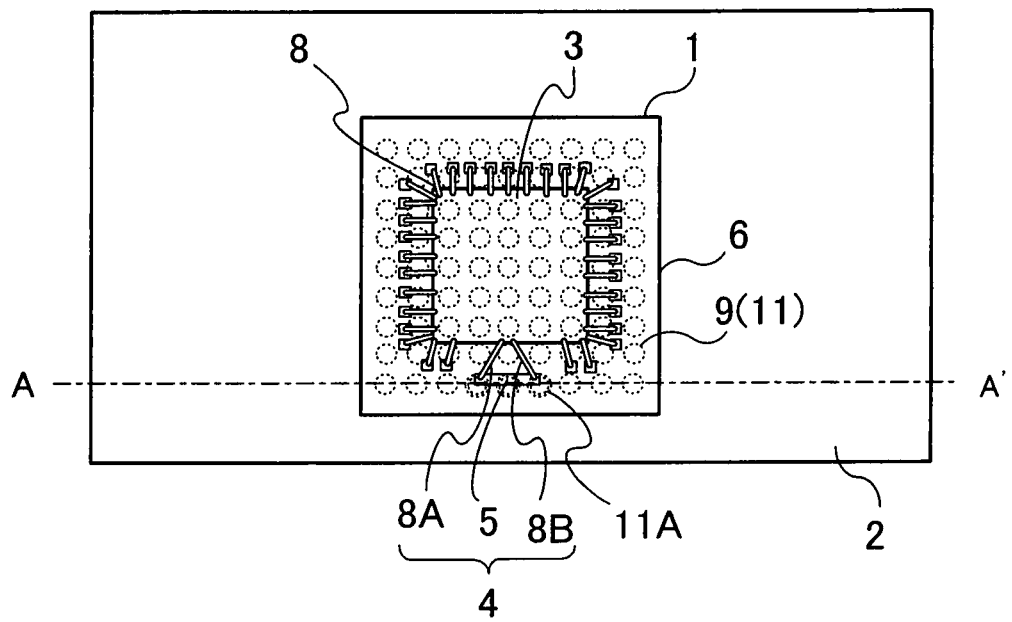
FIG. 1A is a top view schematically illustrating a configuration of a radio device according to a first embodiment of the present invention.
Figure 1B:
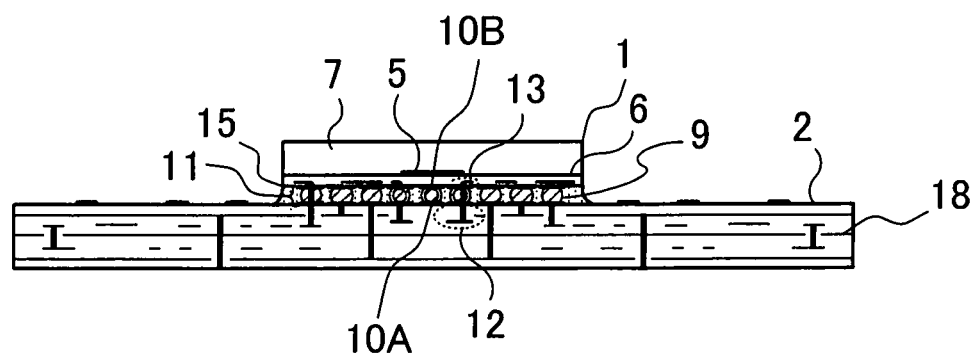
FIG. 1B is a cross-sectional view taken along the line A-A' of FIG. 1A.
Figure 1C:
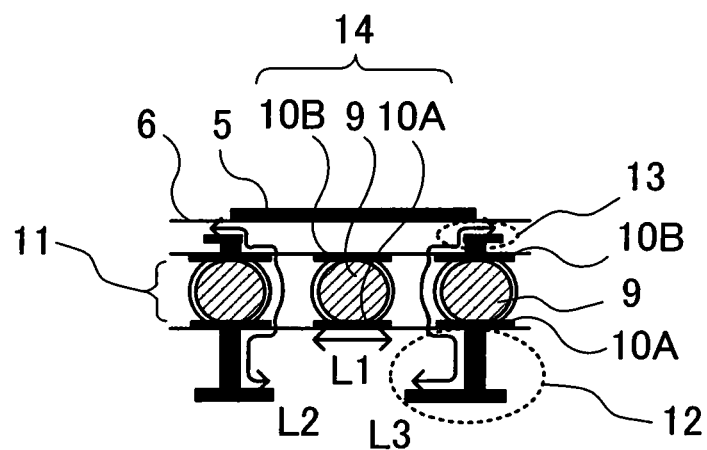
FIG. 1C is a partially enlarged view of FIG. 1B.

FIG. 1A is a top view schematically illustrating a configuration of a radio device according to a first embodiment of the present invention, FIG. 1B is a cross-sectional view taken along the line A-A' of FIG. 1A, and FIG. 1C is a partially enlarged view of FIG. 1B.

As illustrated in FIG. 1A, a radio device 100 has a semiconductor package 1 and a mounting board 2 connected to the semiconductor package 1.

The semiconductor package 1 has a interposer 6, a semiconductor chip 3 mounted on one surface of the interposer 6, and an antenna 4 having a conductive element 5 formed on the one surface and connected to the semiconductor chip 3. The semiconductor package 1 further has a seal material 7 for sealing the interposer 6, the semiconductor chip 3, and the antenna 4 and relay terminals 9.

The components of the semiconductor package 1 will be described in detail.

The interposer 6 has a layered structure including at least one dielectric layer or one metal layer in which a conductive plane is formed. The dielectric layer consists of such as epoxy, glass or ceramic. In the metal layer, a conductive plane such as a wiring or a ground constructed of a conductive material like copper, gold, or aluminum is formed. The interposer 6 consists of such as semiconductor substrate or magnetic substrate or combination thereof.

The semiconductor chip 3 has a configuration in which an insulating layer is formed on a chip substrate consisting of silicon, silicon germanium, gallium arsenide and the like and circuit components. The semiconductor chip 3 illustrated in FIG. 1A has a rectangular shape, but not limited to. The semiconductor chip 3 consists of dielectric substrate, magnetic substrate, or metal or combination thereof.

The semiconductor chip 3 is connected to the antenna 4. As illustrated in FIG. 1A, the semiconductor chip 3 is mounted on one surface of the interposer 6 and is connected to the interposer 6 by bonding wires 8. Or, the semiconductor chip 3 may be connected to the interposer 6 by bumps or solder balls.

Although the semiconductor package 1 has one semiconductor chip 3 in the example of FIG. 1A, a plurality of the semiconductor chips 3 may be provided. In this case, the plurality of semiconductor chips 3 may be arranged horizontally or vertically.

The antenna 4 has a conductive element 5 and bonding wires 8A and 8B for connecting the semiconductor chip 3 and conductive element 5.

The conductive element 5 is formed on one surface of the interposer 6 on which the semiconductor chip 3 is mounted. The conductive element 5 is a plate-like element formed of metal such as copper, aluminum, or gold. The conductive element 5 is connected to the semiconductor chip 3 at its both end portions through the bonding wires 8A and 8B.

The antenna 4 is a loop antenna constituted by the bonding wire 8A, conductive element 5, and bonding wire 8B. The operating frequency of the radio device 100 is a frequency of a carrier wave that the semiconductor chip 3 utilizes for signal transmission/reception and is hereinafter referred to an operating frequency of the antenna 4.

Next, the mounting board 2 will be described.

The mounting board 2 has a layered structure including at least one dielectric layer or one metal layer in which a conductive plane is formed. The dielectric layer consists of such as epoxy, glass or ceramic. In the metal layer, a conductive plane such as wiring or ground constructed of a conductive material like copper, gold, or aluminum is formed. In the example of FIG. 1A, the mounting board 2 has a seven-layer structure in which the metal layer and dielectric layer are alternately formed.

The details of a connection portion 11 will be described using FIGS. 1B and 1C.

The connection portion 11 has a pad 10B formed on the surface (hereinafter, referred to a connecting surface) opposite to the surface of the interposer 6 on which the semiconductor chip 3 is mounted. Further, the connection portion 11 has a pad 10A formed on one surface of the mounting board 2 and a relay terminal 9 connecting the pads 10A and 10B. The relay terminal 9 is, e.g., a solder ball.

As illustrated in FIGS. 1A and 1B, the semiconductor package 1 is connected to the mounting board 2 by a plurality of connection portions 11. The plurality of connection portions 11 are arranged in a matrix at even intervals as illustrated in FIG. 1A. If some of the connection portions 11 illustrated in FIG. 1A are omitted, or if the connection portions 11 of FIG. 1A are irregularly arranged, a crack or distortion may occur in the connection portion 11 when external force is applied to the semiconductor package 1 or the mounting board 2.

The pad 10A is connected to a metal layer of the mounting board 2. The pad 10B is connected to a metal layer of the interposer 6. The respective connections of the pads 10A and 10B to the metal layers of the mounting board 2 and the interposer 6 allow electrical connection to be established between the mounting board 2 and the interposer 6.

The pad 10A or pad 10B is sometimes connected or sometimes not to a conductive plane formed on the metal layer of the interposer 6 or a conductive plane 12 formed on the metal layer of the mounting board 2, depending on a conductive plane configuration of the mounting board 2 or interposer 6.

The radio device 100 according to the present embodiment is designed such that a first electrical length of a first connection portion 11A which is the connection portion closest to the conductive element 5 among the plurality of the connection portions 11 or a second electrical length of the first connection portion 11A including a conductive plane of the mounting board 2 or interposer 6 connected to the first connection portion 11A is less than ½ wavelength of the operating frequency of the antenna 4.

As illustrated in FIG. 1B, the layer in which the relay terminals 9 exist is filled with an underfill material 15. The underfill material is used to tighten the connection between the semiconductor package 1 and the mounting board 2 as needed.

The details of the first connection portion 11A will be described using FIGS. 1A and 1C.

The first connection portion 11A is the connection potion closest to the conductive element 5 among the plurality of the connection portions 11. When viewing the radio device 100 from the semiconductor package 1 side as illustrated in FIG. 1A, the first connection portion 11A exists at a portion that overlaps the conductive element 5 at least partially. In FIG. 1A, the first connection portion 11A is denoted by a double dotted line. In the example of FIG. 1A, three first connection portions 11A are formed. As described above, a plurality of first connection portions 11A may be formed.

When metal exists near a radiation source (conductive element 5) of the antenna 4 as illustrated in FIG. 1A, the radiation efficiency of the antenna 4 degrades due to influence of the metal.

In order to cope with this, in the radio device according to the present embodiment, the first electrical length of the first connection portion 11A is set to a length that is difficult to give influence on the radiation of the antenna 4.

Next, the first electrical length of the first connection portion will be described using FIG. 1C. The first electrical length is the length of the longest one of the paths of current flowing in the first connection portion 11A. The first connection portion 11A has the pad 10A, pad 10B, and relay terminal 9. When the pads 10A and 10B are ellipsoids, the electrical lengths thereof each correspond to the long diameter of the ellipsoid, and when the pads 10A and 10B are rectangles, the electrical lengths thereof each correspond to the long side of the rectangle. When the relay terminal 9 is a solder ball, the electrical length thereof corresponds to the diameter of the solder ball, and when the relay terminal 9 is a pin, the electrical length thereof corresponds to the length of the pin. The first electrical length of the first connection portion 11A is set to the electrical length of longer one of the electrical lengths of the pad 10A, pad 10B, and relay terminal 9. In the present embodiment, the first electrical length of the first connection portion 11A is set to less than ½ wavelength of the operating frequency of the antenna 4. This makes it difficult for the first connection portion 11A to resonate at the operating frequency, suppressing degradation of the radiation efficiency of the antenna 4.

Subsequently, the second electrical length of the first connection portion 11A including a conductive plane of the mounting board 2 or interposer 6 connected to the first connection portion 11A will be described using FIG. 1C. As illustrated in FIG. 1, a part of the first connection portion 11A is connected to the conductive plane 12 of the mounting board 2 or the conductive plane 13 of the interposer 6. In this case, not only the first connection portion 11A, but also the conductive plane 12 or conductive plane 13 connected to the first connection portion 11A gives influence on the radiation characteristics of the antenna 4. In order to cope with this, in the present embodiment, the electrical length (second electrical length) of the first connection portion 11A including the conductive planes 12 and 13 is set to less than ½ wavelength of the operating frequency of the antenna 4. The second electrical length is the length of the longest one of the paths of current flowing in the first connection portion 11A including conductive plane 12 of the mounting board 2 connected to the first connection portion 11A or conductive plane 13 of the interposer 6 connected to the first connection portion 11A.

For example, in the case where the conductive plane 12 or 13 of the mounting board 2 or interposer 6 is branched as illustrated in FIG. 1C, the second electrical length is the longest distance between the open end of the conductive plane connected to the first connection portion 11A and another open end thereof.

That is, the first to second electrical lengths of the first connection portion are the length of the longest one of the paths of current flowing in the first connection portion including the conductive planes connected to the first connection portion.

In the example of FIG. 1C, the first electrical length is L1, and the second electrical length is L2 or L3. In the case of the present embodiment, the longest one of the electrical lengths L1, L2, and L3 should be set to less than ½ wavelength of the operating frequency of the antenna 4.

Next, effect obtained by setting the first and second electrical lengths to less than ½ wavelength of the operating frequency of the antenna 4 will be described using FIG. 2.

When current flows in the antenna 4, current is also induced in a conductor near the antenna 4. When this induced current interferes with the current flowing in the antenna 4, impedance characteristics and radiation characteristics of the antenna 4 degrade.

In the case where the conductor near the antenna 4 has a length of an integral multiple of the length corresponding to ½ wavelength of the operating frequency, the conductor resonates and thereby large current is induced. On the other hand, in the case where the conductor has a length of less than ½ wavelength of the operating frequency, the length of the conductor falls short of a length for resonance, so that induced current is small. Further, in the case where the conductor has a length of more than ½ wavelength of the operating frequency, although smaller than in the case where the conductor has a length corresponding to ½ wavelength of the operating frequency and thereby resonates with the antenna 4, larger current than in the case where the conductor has a length of less than ½ wavelength of the operating frequency is induced.

Figure 2:
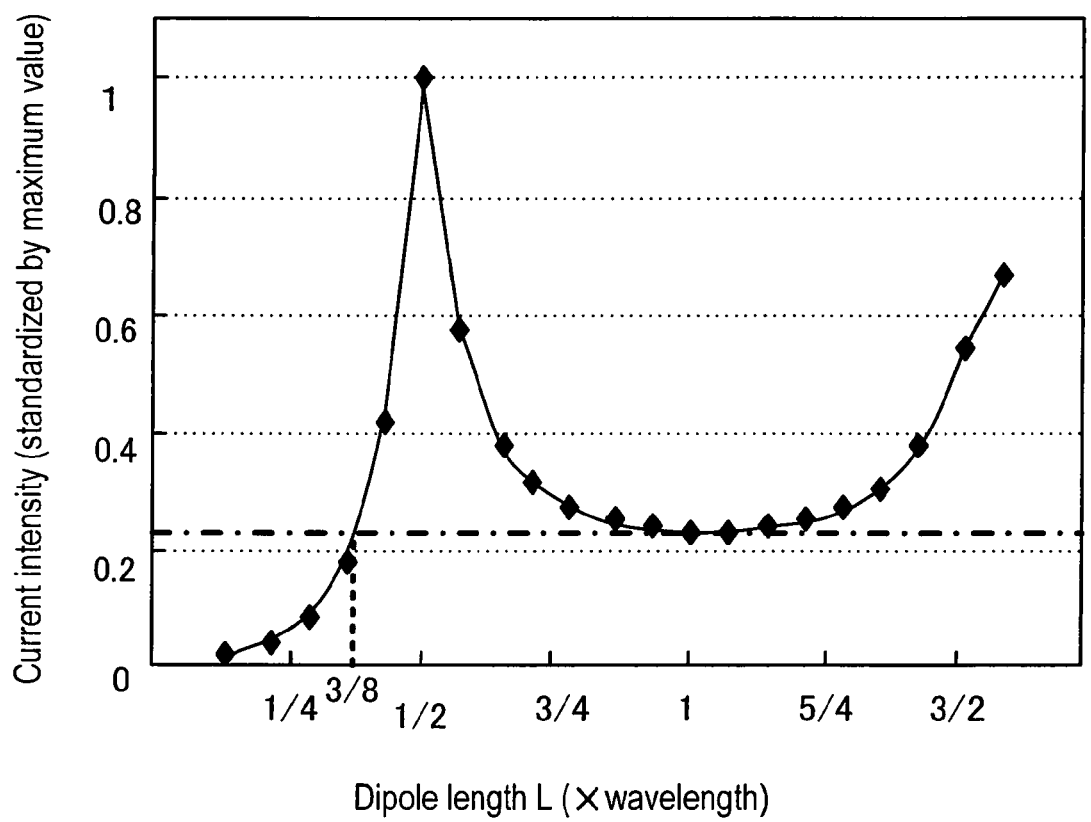
FIG. 2 is a graph representing the intensity of current induced in a linear conductor when a planar wave enters a dipole of a length L in parallel thereto.

FIG. 2 is a graph representing the intensity of current induced when a planar wave enters a linear conductor of a length L in parallel thereto. In FIG. 2, the horizontal axis represents the length L of the linear conductor by a factor of the wavelength of the operating frequency, and vertical axis represents the current intensity normalized by the maximum value. As is clear from FIG. 2, when the length L of the dipole is an odd multiple (e.g., ½ times, 3/2 times, . . . ) of ½ wavelength of the operating frequency, the linear conductor resonates, so that the intensity of current induced in the linear conductor is increased. On the other hand, when the length L of the linear conductor is less than ½ wavelength of the operating frequency, the current intensity is reduced. In particular, when the length L of the linear conductor is less than ⅜ wavelength of the operating frequency, the reduction in the current intensity becomes noticeable.

Thus, by setting the length of a conductor near the antenna 4 to at least less than substantially ½ wavelength of the operating frequency, induction of current into the conductor near the antenna 4 can be suppressed to reduce interference with the antenna 4.

As described above, according to the present embodiment, by setting the first electrical length of the first connection portion 11A or second electrical length of the first connection portion 11A including the conductive plane 12 or of the mounting board 2 or interposer 6 connected to the first connection portion 11A to less than ½ wavelength of the operating frequency of the antenna 4, current induced in the first connection portion 11A can be suppressed. As a result, even when the antenna 4 is incorporated in the radio device, interference on the antenna 4 can be reduced to thereby reduce degradation of the impedance characteristics and radiation characteristics of the antenna 4.

There can be considered a simple method of eliminating the first connection portion 11A near the antenna 4 in order to prevent current from flowing in a conductor near the antenna 4. However, when the first connection 11A is eliminated, the arrangement of the connection portion 11 is made irregular, so that warpage occurs in the interposer 6 within the semiconductor package 1 or mounting board 2, causing joint failure. In the case where the connection portion 11 near the antenna 4 is removed in correspondence with the antenna shape for the purpose of reducing degradation of the antenna characteristics, the alignment pattern of the connection portion 11 needs to be designed in correspondence with the antenna shape, resulting in increase in production cost. In the present embodiment, it is not necessary to change the arrangement pattern of the relay terminals depending on the antenna shape, thus preventing increase in the production cost.

In the present embodiment, although a loop antenna using the bonding wire has been described as an example of the antenna 4, the shape of the antenna is not limited to this. For example, the antenna 4 may be a dipole antenna not using the bonding wire, an inversed F antenna, a patch antenna, or other antennas.

Figure 1D:
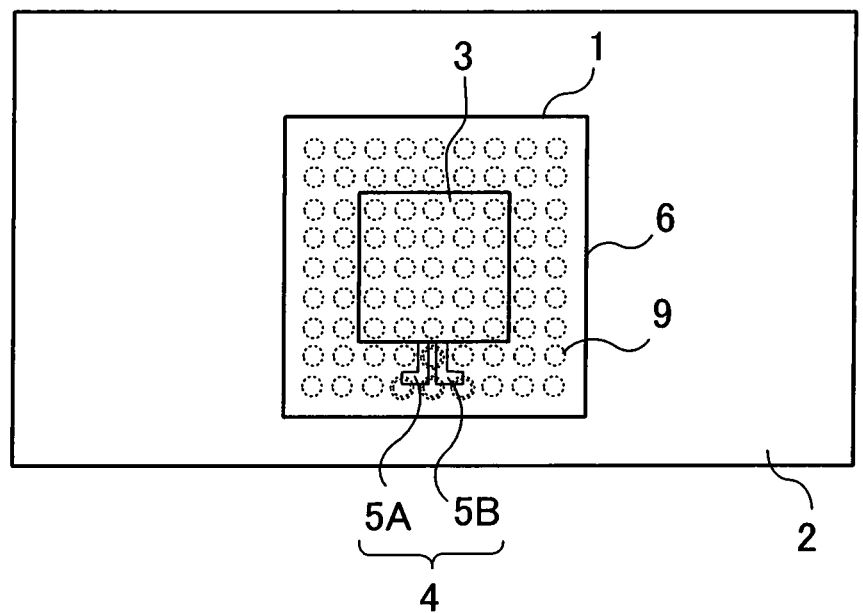
FIG. 1D is a view illustrating a modification of the antenna according to the first embodiment.

FIG. 1D illustrates an example in which the dipole antenna is used as the antenna 4. In the configuration illustrated in FIG. 1D, the antenna has two symmetrical L-shaped linear conductive elements 5A and 5B. The two symmetrical L-shaped linear conductive elements 5A and 5B are directly connected to the semiconductor chip 3 not using a bonding wire. In this manner, all components of the antenna 4 may be formed on the mounting board 2. In this case, four connection portions denoted by thick dotted lines correspond to the first connection portion closest to the two L-shaped linear conductive elements.

Modification of First Embodiment

Figure 3:
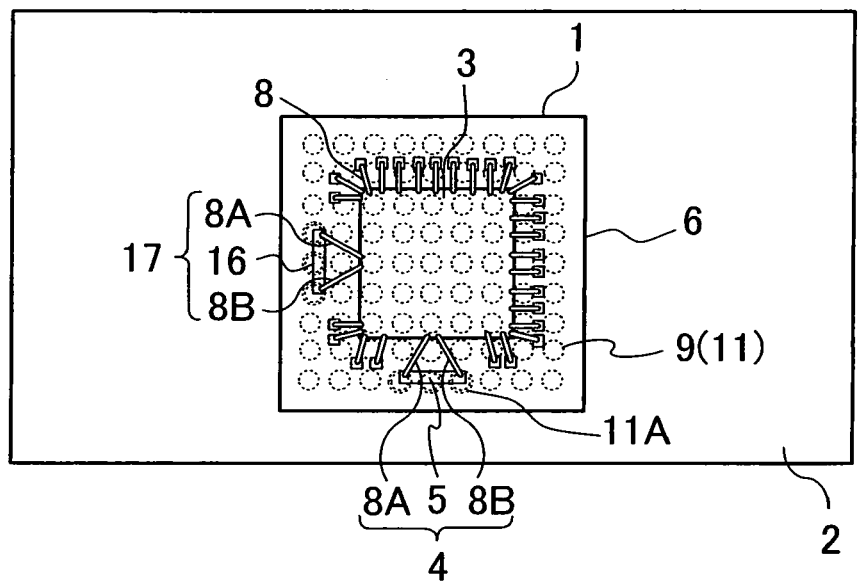
FIG. 3 is a top view schematically illustrating a configuration of a radio device according to a modification of the first embodiment of the present invention.

FIG. 3 is a top view schematically illustrating a configuration of a radio device according a modification of the first embodiment of the present invention. The radio device illustrated in FIG. 3 differs from the radio device of FIG. 1 in that it has a plurality of antennas. Although two antennas are incorporated in the semiconductor package 1 in the example of FIG. 3, the number of the antennas may be three or more.

The radio device of FIG. 3 has an antenna 17 in addition to the configuration of the radio device of FIG. 1. The antenna 17 has the same configuration as that of the antenna 4 of FIG. 1. In the radio device of FIG. 3, not only the connection portion 11 closest to the antenna 4 but also a connection portion 11 closest to the antenna 17 serves as the first connection portion. In this example, all the connection portions 11 located just below the conductive elements 5 and serve as the first connection portion. That is, the connection portion 11 exists at a portion that overlaps the areas of the conductive elements 5 and 16 at least partially as viewing the mounting board 2 from the semiconductor package 1 side. In FIG. 3, the first connection portions are denoted by double dotted lines.

According to the present modification, the first electrical length and second electrical length of the first connection portion closest to the antenna 4 and those of the first connection portion closest to the antenna 17 are set to less than substantially ½ wavelength of the operating frequency. In the case where the operating frequencies of the antennas 4 and 17 differ from each other, the first and second electrical lengths of the first connection portion should be set to less than substantially ½ wavelength of the operating frequency of the closest antenna.

Second Embodiment

Figure 4A:
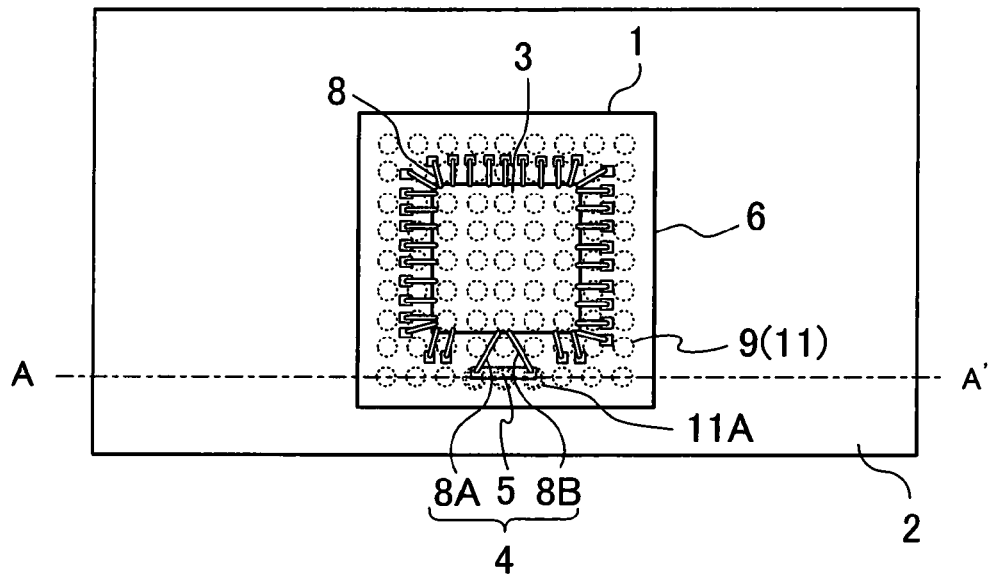
FIG. 4A is a top view schematically illustrating a configuration of a radio device according to a second embodiment of the present invention.
Figure 4B:
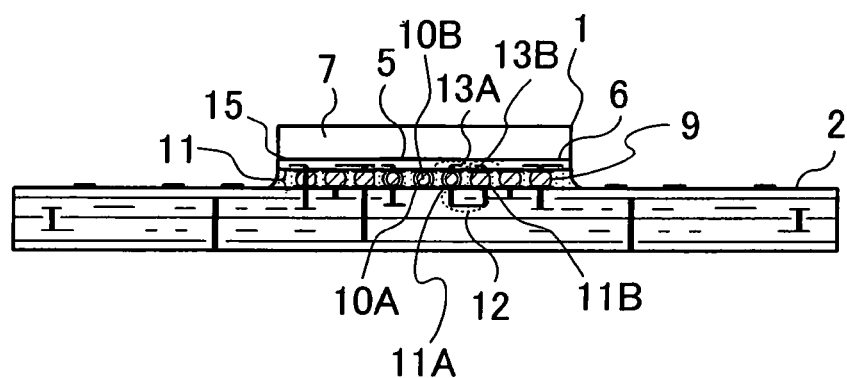
FIG. 4B is a cross-sectional view taken along the line A-A' of FIG. 4A.
Figure 4C:
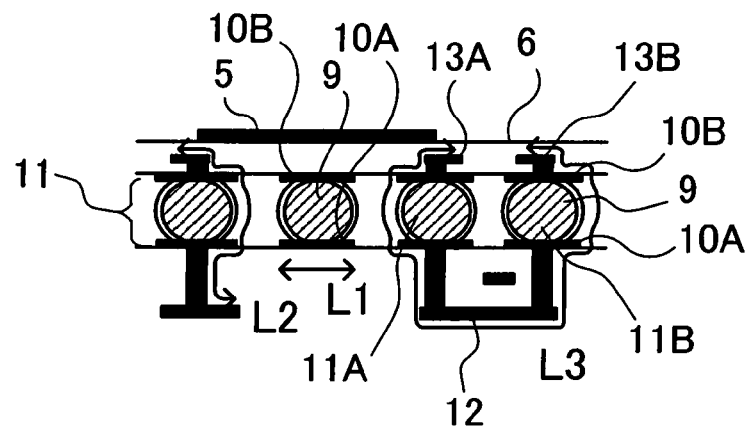
FIG. 4C is an enlarged view of a connection portion located just below a conductive element of FIG. 4B.

FIG. 4A is view top schematically illustrating a configuration of a radio device according to a second embodiment of the present invention, and FIG. 4B is a cross-sectional view taken along the line A-A' of FIG. 4A. Further, FIG. 4C is a partially enlarged view of FIG. 4B.

The configuration of the radio device illustrated in FIG. 4A is the same as that of the radio device of FIG. 1 except for a point that a part of the first connection portion is connected to another connection portion 11.

As illustrated in FIG. 4B, a conductive plane 12 is connected to the first connection portion 11A. As described above, in order for the radiation efficiency of the antenna 4 to be less influenced by the presence of the metal component near the radiation source of the antenna, the length of a conductor arranged nearest the antenna 4 is set to less than ½ wavelength of the operating frequency of the antenna 4. Thus, the electrical length (third electrical length) of the first connection portion 11A including the connection portion 11 (hereinafter, referred to as a second connection portion 11B) connected to the first connection portion 11A and conductive planes connected to the first connection portion 11A and second connection portion 11B is set to less than ½ wavelength of the operating frequency of the antenna 4.

The details of the third electrical length will be described using FIG. 4C.

In the example of FIG. 4C, the third electrical length is the length obtained by combining the length of the conductive plane 12 of the mounting board 2 having one end connected to the first connection portion 11A and the other end connected to the second connection portion 11B, length of the conductive plane 13A of the interposer 6 having one end connected to the first connection portion 11A and the other end opened, length of the conductive plane 13B of the interposer 6 having one end connected to the second connection portion 11B and the other end opened, and length of the longest one of the paths connecting portions at which the first and second connection portions 11A and 11B are connected to the conductive planes. That is, the third electrical length is the longest one of lengths from the open end of a conductive plane connected to the first connection portion 11A to the open end of another conductive plane connected to the first connection portion 11A. In this case, the conductive plane may indirectly be connected to the first connection portion 11A. That is, for example, like the conductive plane 13B of FIG. 4C, the conductive plane may be one which is connected to the second connection portion 11B and connected to the first connection portion 11A through the conductive plane 12 and second connection portion 11B.

That is, the first to third electrical length of the first connection portion 11A are the length of the longest one of the paths of current flowing in the first connection portion 11A including the conductive planes connected to the first connection portion 11A.

In the example of illustrated in FIG. 4C, the first electrical length is L1, and the second electrical length is L2, and the third electrical length is L3. In the case of the present embodiment, the longest one of the electrical lengths L1, L2, and L3 should be set to less than ½ wavelength of the operating frequency of the antenna 4. Other configurations and operating principle are the same as those of the radio device of FIG. 1.

Although one second connection portion 11B is connected to the first connection portion 11A in the example of FIG. 4A, the number of the second connection portions 11B connected to the first connection portion 11A mat be two or more.

According to the present embodiment, the same effect as in the first embodiment can be obtained. Further, the first connection portion 11A can be connected to another connection portion 11 by a conductive plane, so that the flexibility of design of the conductive plane is increased.

Third Embodiment

Figure 5A:
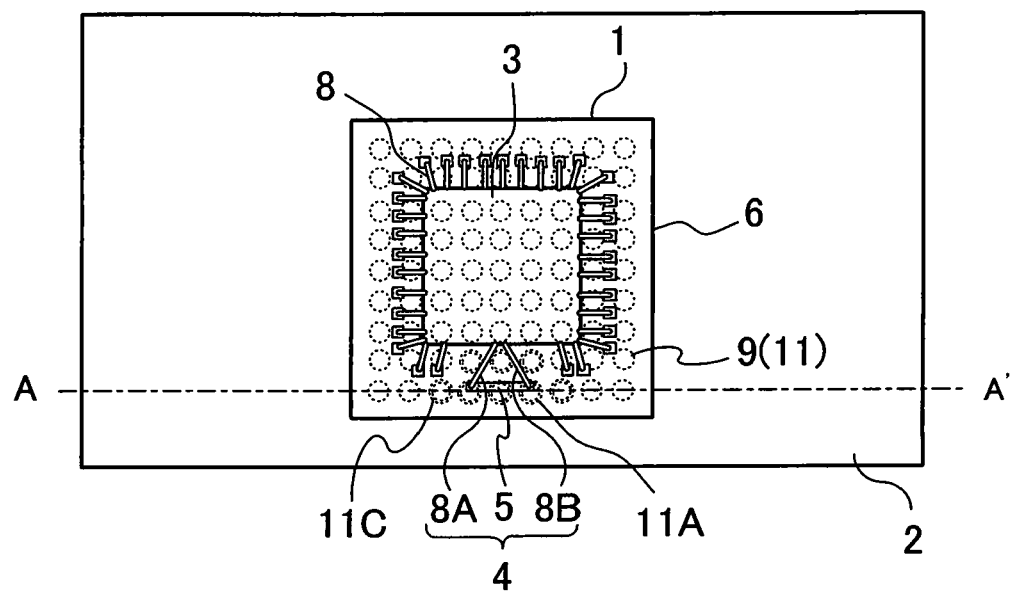
FIG. 5A is a top view schematically illustrating a configuration of a radio device according to a third embodiment of the present invention.
Figure 5B:
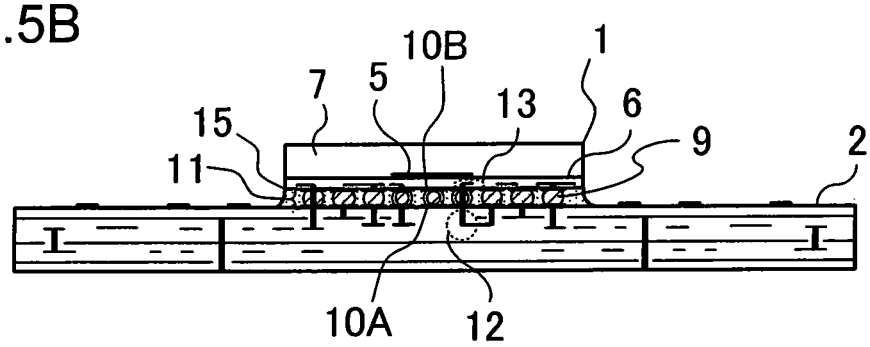
FIG. 5B is a cross-sectional view taken along the A-A' line of FIG. 5A.

FIG. 5A is a top view schematically illustrating a configuration of a radio device according to a third embodiment of the present invention, and FIG. 5B is a cross-sectional view taken along the A-A' line of FIG. 5A.

The radio device according to the third embodiment differs from the radio device of FIG. 4 in that not only the first to third electrical lengths of the first connection portion 11A, but also those of a third connection portion 11C adjacent to the first connection portion 11A are set to less than ½ wavelength of the operating frequency.

A first electrical length of the third connection portion 11C is the length of the longest one of the paths of current flowing in the third connection portion 11C. Second to third electrical lengths of the third connection portion 11C are the length of the longest one of lengths from the open end of a conductive plane connected to the third connection portion 11C to the open end of another conductive plane connected to the third connection portion 11C. That is the second to third electrical lengths of the third connection portion 11C are the length of the longest one of the paths of current flowing in the third connection portion 11C including the conductive planes connected to the third connection portion 11C. In the example of FIG. 5B, the longest one of the first to third electrical lengths of the first and third connection portions 11A and 11C should be set to less than ½ wavelength of the operating frequency of the antenna 4. Other configurations are the same as those in the radio device of FIG. 1.

Next, the reason for setting not only the first to third electrical lengths of the first connection portion 11A, but also those of the third connection portion 11C to less than ½ wavelength of the operating frequency of the antenna 4 will be described.

As described above, strong current is induced by current flowing in the antenna 4 and flows in a conductor nearest the antenna 4. Current is induced in not only the conductor nearest the antenna 4, but also in a conductor (in the present embodiment, third connection portion 11C) adjacent to the conductor nearest the antenna 4. This induced current interferes with the current flowing in the antenna 4, degrading impedance characteristics and radiation characteristics of the antenna 4.

According to the present embodiment, the same effect as in the second embodiment can be obtained. Further, by setting not only the first to third electrical lengths of the first connection portion 11A, but also those of the third connection portion 11C to less than ½ wavelength of the operating frequency of the antenna 4, it is possible to reduce influence that the current induced in the third connection portion 11C gives on the antenna 4.

Fourth Embodiment

Figure 6A:
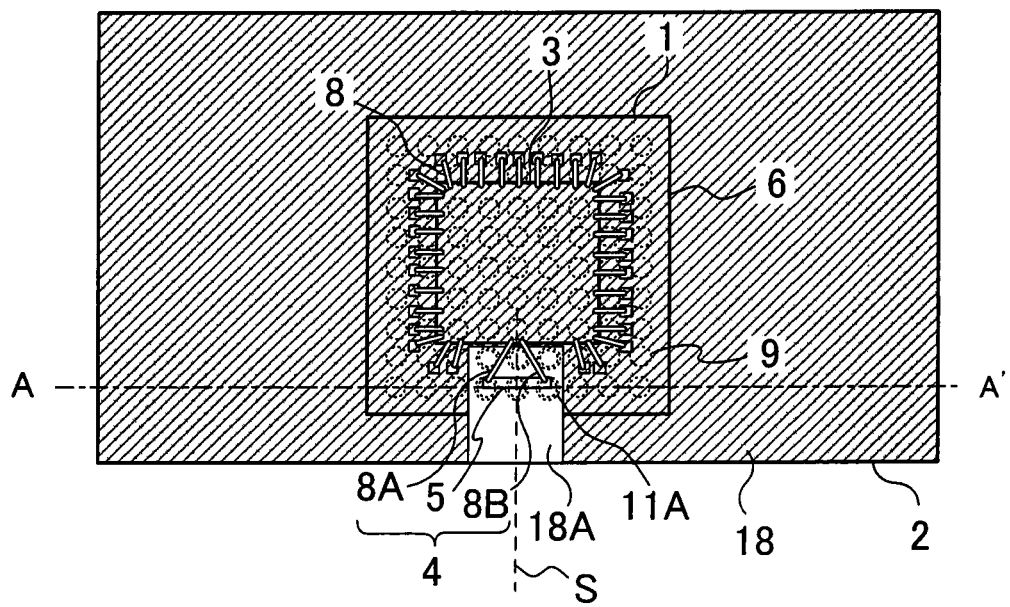
FIG. 6A is a top view schematically illustrating a configuration of a radio device according to a fourth embodiment of the present invention.

FIG. 6A is a top view schematically illustrating a configuration of a radio device according to a fourth embodiment of the present invention, and FIG. 65 is a cross-sectional view taken along the A-A' line of FIG. 6A.

The radio device according to the fourth embodiment is the same as that of FIG. 1 except for a point that no conductive plane other than the conductive plane 12 or 13 connected to the connection portion 11 is formed in a part (hereinafter, referred to a rectangular region) of the metal layer of the mounting board 2.

The mounting board 2 of FIG. 6A has seven metal layers including the front and rear surfaces thereof. In the example of FIG. 6, a plate-like metal is formed in the even-numbered metal layer position from the metal layer near the semiconductor package, and wiring is formed in the odd-numbered metal layer position. The conductive planes in the metal layers may be connected by vias. The plate-like metal is used as a power supply or a ground.

The mounting board 2 according to the present embodiment has, in a part of the metal layer, a region with no conductive plane other than the conductive plane 12 or 13 connected to the connection portion 11. The region corresponds to a rectangular region 18A of FIG. 6A that includes the first connection portion 11A and antenna when the mounting board 2 is viewed from the semiconductor package 1 side. Conductive planes are formed not in the region 18A but in a shaded portion 18 of FIG. 6A. That is, the mounting board 2 has a layered structure and has metal layers in which no conductive plane other than the conductive plane 12 or 13 connected to the connection portion 11 is formed in the selected region 18A opposite to the conductive element and first connection portion 11A.

Figure 6B:
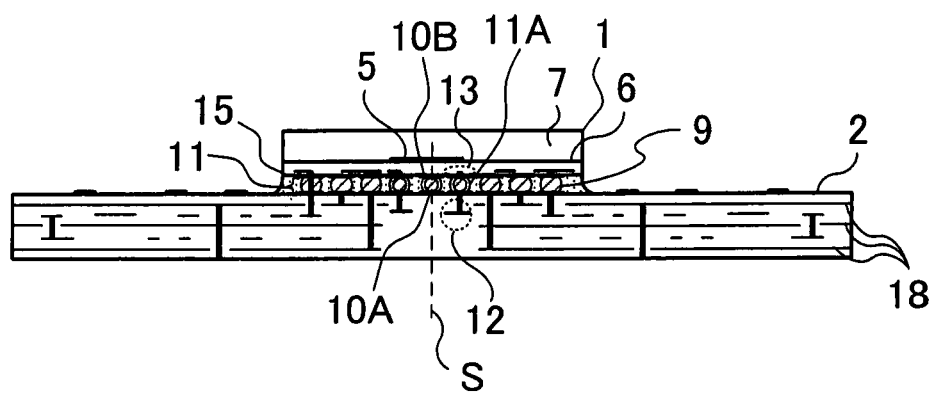
FIG. 6B is a cross-sectional view taken along the A-A' line of FIG. 6A.

FIG. 6B is a cross-sectional view taken along the A-A' line drawn over the radio device according to the present embodiment. As illustrated in FIG. 6B, no conductive plane other than the antenna 4, first connection portion 11A, and conductive planes 12 and 13 connected to the first connection portion 11A is formed in the selected region.

As described above, in the radio device according to the present embodiment, no conductive plane is formed in the selected region of the metal layer of the mounting board 2 that is near the antenna 4, so that it is possible to suppress interference that the conductive plane formed in the metal layer of the mounting board 2 causes to the antenna 4, thereby reducing degradation of the impedance characteristics and radiation characteristics of the antenna 4.

For example, in the case where the antenna has a line-symmetric shape as in the radio device according to the present embodiment, the rectangular region 18A is formed into a line-symmetric shape with respect to the same symmetry axis S as that of the antenna 4. With this configuration, not only the antenna 4, but also current induced in the mounting board 2 is made substantially symmetric with respect to the symmetry axis S, thereby making the antenna radiation pattern substantially symmetric.

Although no conductive plane is mounted in the selected region of the mounting board 2 of the radio device of FIG. 1 in the present embodiment, a configuration may be adopted in which no conductive plane is mounted in the selected region of the mounting board 2 of the radio devices illustrated in FIGS. 3 to 5 in addition to the radio device of FIG. 1. In the case of the radio device of FIG. 3, the same region as the selected region 18A may be formed not only near the antenna 4 but also near the antenna 17. Further, in the case of the radio device of FIG. 5, a configuration may be adopted in which no conductive plane is formed not only in a region including the first connection portion 11A, but also a region including the third connection portion 11C.

Fifth Embodiment

Figure 7A:
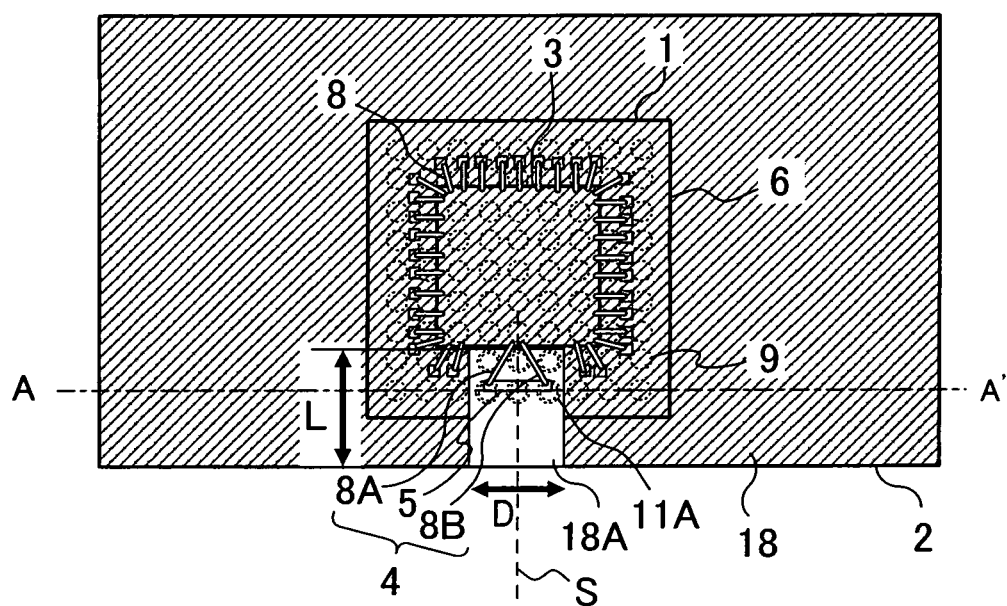
FIG. 7A is a view schematically illustrating a configuration of a radio device according to a fifth embodiment of the present invention.
Figure 7B:
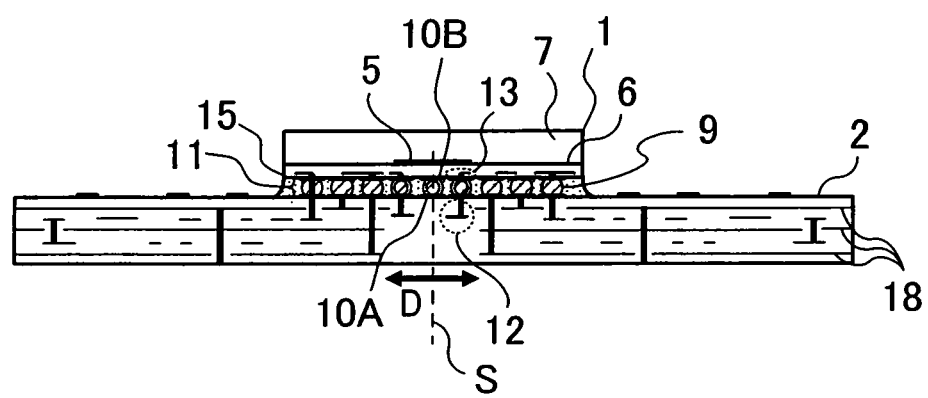
FIG. 7B is a cross-sectional view taken along the A-A' line of FIG. 7A.

FIG. 7A is a view schematically illustrating a configuration of a radio device according to a fifth embodiment of the present invention, and FIG. 7B is a cross-sectional view taken along the line A-A' of FIG. 7A.

The radio device according to the fifth embodiment is the same as that of FIG. 6A in that no conductive plane is formed in the selected region 18A of the metal layer of the mounting board 2 but differs therefrom in the size of the selected region 18A.

As illustrated in FIG. 7, the antenna has a symmetric shape with respect to the symmetry axis S.

The selected region 18A of the metal layer of the mounting board 2 has a rectangular shape having first sides parallel to the symmetry axis S and second sides perpendicular to the symmetry axis S. The length of each of the first sides parallel to the symmetry axis S is assumed to be L, and the length of each of the second sides perpendicular to the symmetry axis S is assumed to be D. At this time, the length D of the second side of the selected region 18A is assumed to be k/2 (k is an odd number) wavelength of the antenna operating frequency.

A consideration is now given of current flowing in the mounting board 2. When current flows in the antenna 4, current is also induced in the mounting board 2 near the antenna 4. The current flowing in the mounting board 2 flows along the sides of the mounting board 2. At this time, in the selected region 18A, this current flows along the sides of the selected region 18A. This is because large current flows along the metal sides included in the mounting board 2.

The antenna 4 has a symmetric shape with respect to the symmetry axis S, and selected region 18A of the metal layer of the mounting board has a symmetric shape with respect to the symmetry axis S, so that currents flowing the first sides of the selected region 18A parallel to the symmetry axis S have the same intensity but have the opposite phases.

Figure 8:
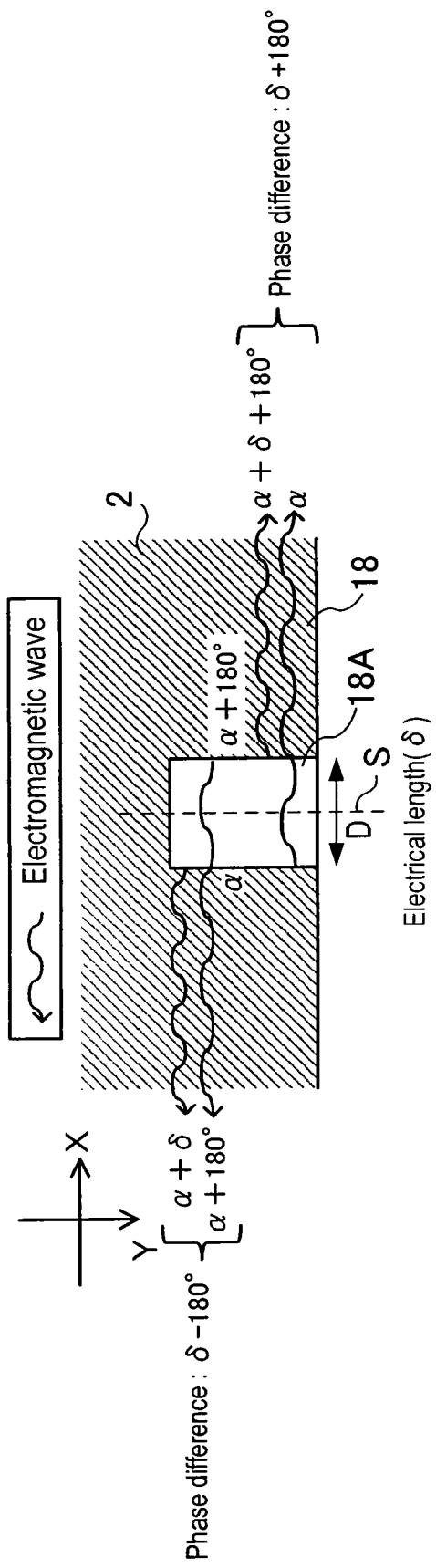
FIG. 8 is a view schematically illustrating electromagnetic waves radiated respectively from the sides of the rectangular region of the mounting board conductive plane in the configuration of FIG. 7A.

FIG. 8 schematically illustrates electromagnetic waves radiated from the first sides of the selected region 18A of the mounting board 2. As illustrated in FIG. 8, when the phase of the electromagnetic waves radiated from one of the first sides (extending in Y-direction) of the region 18A parallel to the symmetry axis S is assumed to be α, the phase of the electromagnetic waves radiated from the other one of the first sides becomes opposite, i.e., α+180° In FIG. 8, electromagnetic waves radiated respectively from the two first sides of the region 18A substantially parallel to the symmetry axis S in the direction perpendicular to the symmetry axis S, i.e., ±X directions have a phase difference of δ−180° in −X direction and have a phase difference of δ+180° in +X direction. The δ is a value representing the magnitude of the phase shifted by the length D of the second side of the selected region 18A.

In the radio device according to the present embodiment, the length D of the second side is k/2 (k is an odd number) wavelength of the operating frequency, so that the δ is an odd multiple of 180°. Thus, the phase difference between the electromagnetic waves radiated respectively from the first sides is δ−180° in −X direction, i.e., an even multiple of 180° and δ+180° in +X direction, i.e., an even multiple of 180°, so that the electromagnetic waves radiated respectively from the first sides are the same in phase and are thus added to each other. That is, in the radio device according to the present embodiment, electric waves are easily radiated in the ±X directions of FIG. 8.

Figure 9:
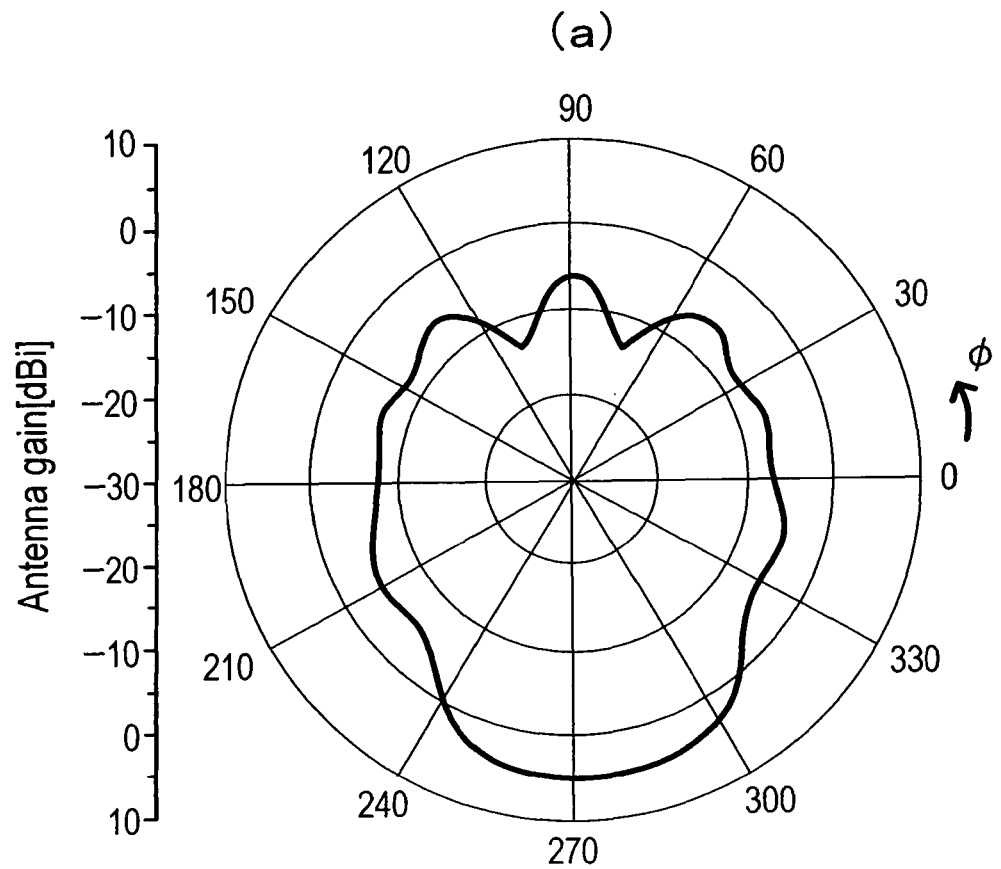
FIG. 9 is a view illustrating radiation pattern characteristics in a simplified model of FIG. 7A which are obtained by an electromagnetic field simulation.
Figure 9:
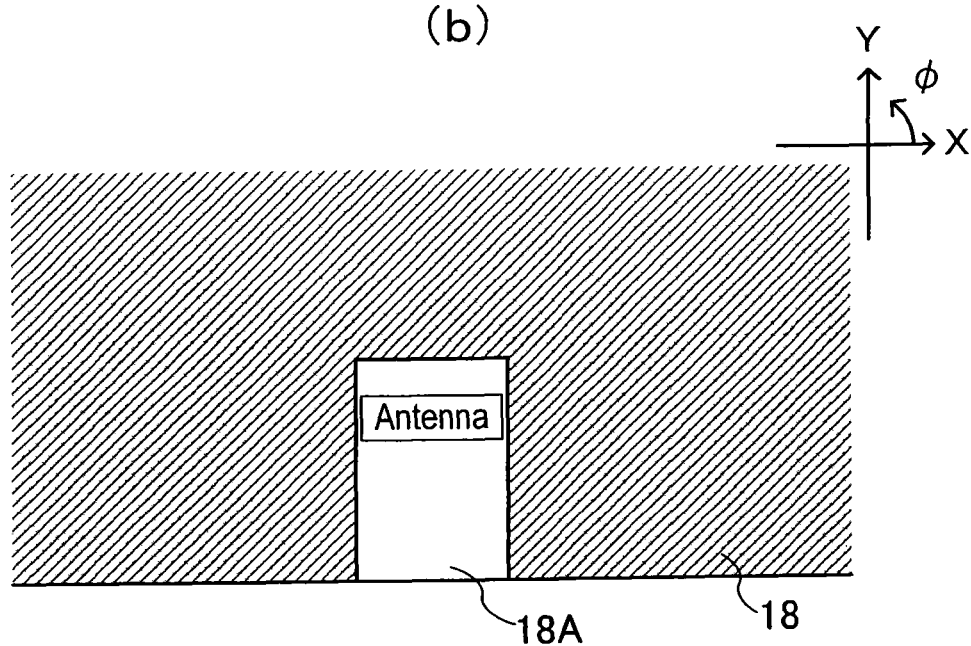
Figure 10:
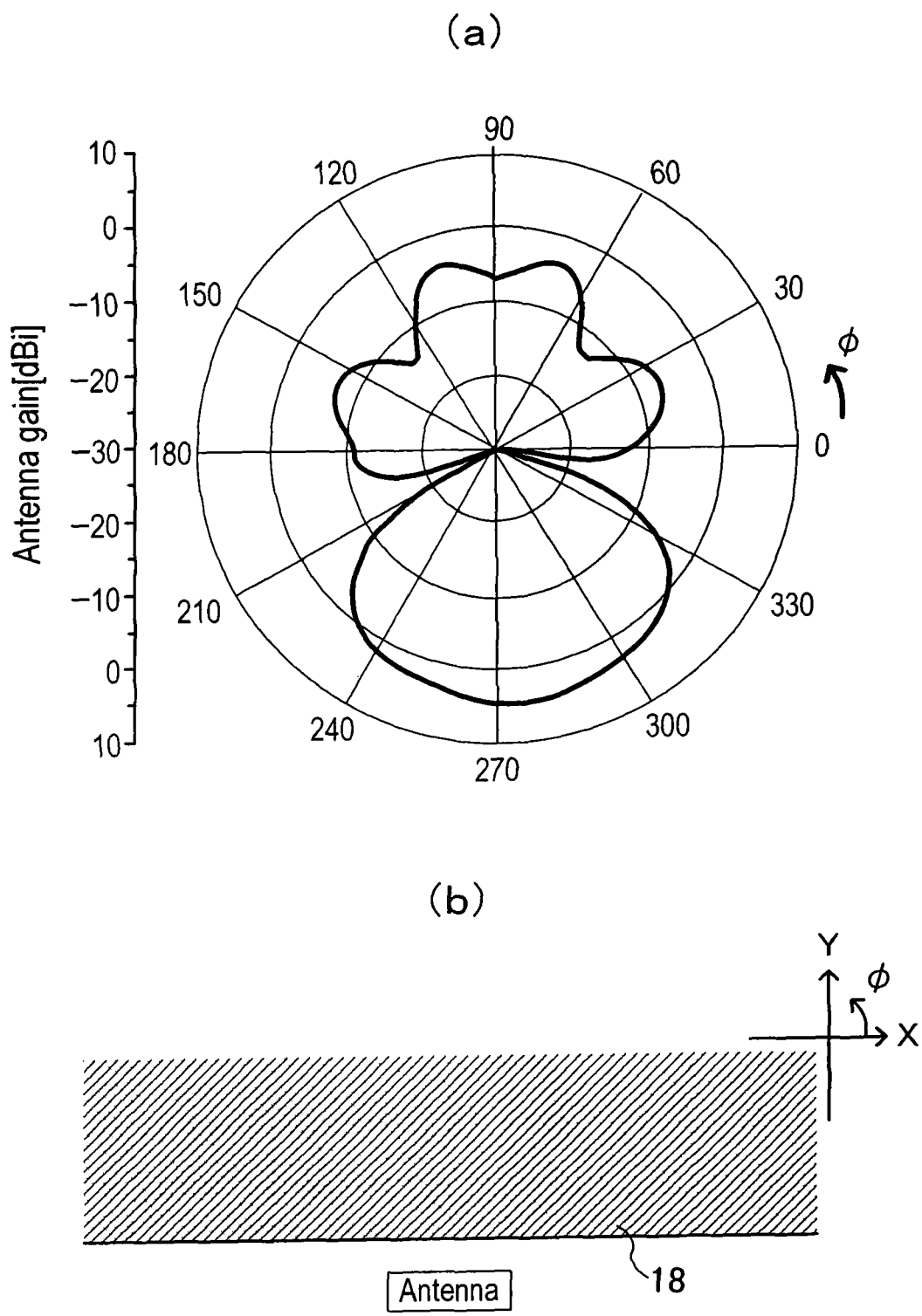
FIG. 10 is a view illustrating radiation pattern characteristics in a radio device of a comparative example which are obtained by an electromagnetic field simulation.

FIG. 9A is a simulation result of a radiation pattern on the XY plane of the radio device of FIG. 7A in the case where the length D of the second side is set to ½ wavelength of the operating frequency. FIG. 9B is a simplified view illustrating the antenna 4 and the region 18A of the metal layer 18 of the mounting board 2. FIG. 10A is a simulation result of a radiation pattern on the XY plane of a radio device of a comparative example. In the comparative example, the selected region 18A of the metal layer 18 is not provided as illustrated in FIG. 10B. That is, FIG. 10A is a simulation result of a radiation pattern on the XY plane of the radio device in the case where there is no influence of current flowing in the first sides of the selected region 18A unlike the case of the radio device of FIG. 7A. As is clear from a comparison between the radiation patterns of FIGS. 9 and 10, radiation in the ±X direction is stronger in the case of FIG. 9.

According to the present embodiment, the same effect as in the first embodiment can be obtained. Further, by setting the length D of the second side of the selected region 18A of the metal layer of the mounting board 2 to k/2 (k is an odd number) wavelength of the operating frequency, it is possible to strengthen the antenna radiation pattern in the direction perpendicular to the symmetry axis S.

Although no conductive plane is mounted in the selected region of the mounting board 2 of the radio device of FIG. 1 in the present embodiment, a configuration may be adopted in which no conductive plane is mounted in the selected region of the mounting board 2 of the radio devices illustrated in FIGS. 3 to 5 in addition to the radio device of FIG. 1. In the case of the radio device of FIG. 3, the same region as the selected region 18A may be formed not only near the antenna 4 but also near the antenna 17. Further, in the case of the radio device of FIG. 5, a configuration may be adopted in which no conductive plane is formed not only in a region including the first connection portion 11A, but also a region including the third connection portion 11C.

Sixth Embodiment

Figure 11A:
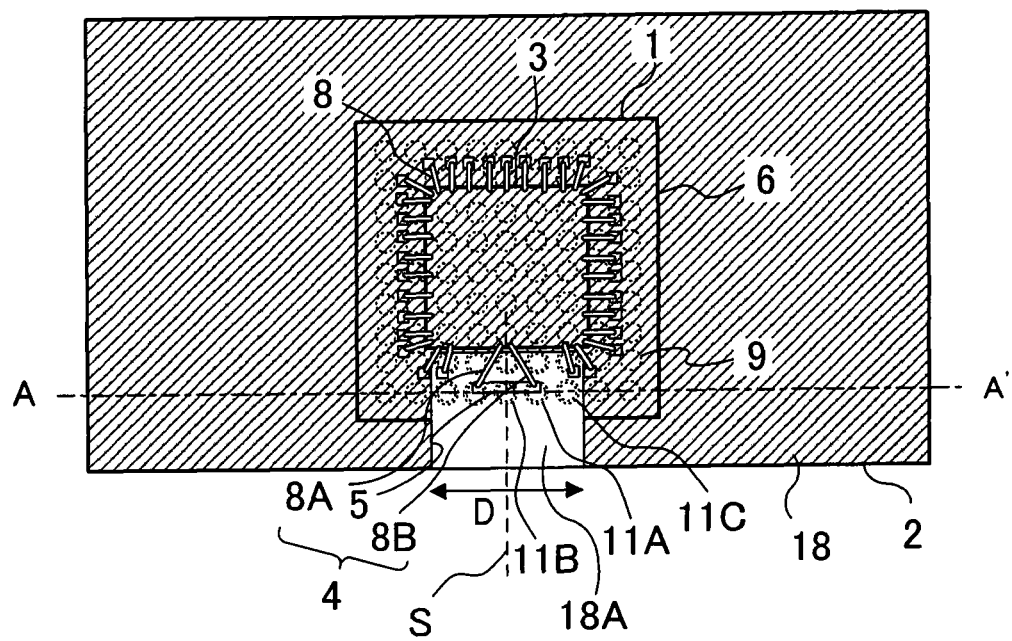
FIG. 11A is a top view schematically illustrating a radio device according to a sixth embodiment of the present invention.
Figure 11B:
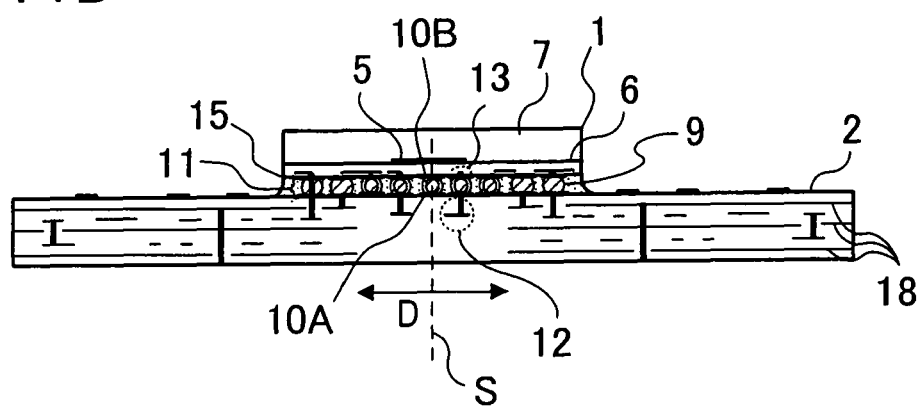
FIG. 11B is a cross-sectional view taken along the A-A' line of FIG. 11A.

FIG. 11A is a top view schematically illustrating a configuration of a radio device according to a sixth embodiment of the present invention, and FIG. 11B is a cross-sectional view taken along the A-A' line of FIG. 11A.

The radio device according to the sixth embodiment is the same as that of FIG. 6 in that no conductive plane is formed in the selected region 18A of the metal layer of the mounting board 2 but differs therefrom in the size of the selected region 18A. Further, in the radio device according to the sixth embodiment, when the mounting board 2 is viewed from the semiconductor package side, the first to third electrical lengths of all the connection portions 11 opposite to the selected region 18A are set to ½ wavelength of the operating frequency of the antenna 4. The connection portions 11 opposite to the selected region 18A are each denoted by thick dotted lines. The connection portions 11 opposite to the selected region 18A include the first connection portions 11A, third connection portions 11B adjacent to the first connection portions 11A, and connection portions 11C which are not adjacent to the first connection portions 11A.

Hereinafter, the size of the selected region 18A will be described.

As illustrated in FIG. 11A, the antenna has a symmetric shape with respect to the symmetry axis S. Further, the selected region 18A of the metal layer of the mounting board 2 has a rectangular shape having first sides parallel to the symmetry axis S and second sides perpendicular to the symmetry axis S. The length of each of the first sides parallel to the symmetry axis S is assumed to be D, and the length of each of the second sides perpendicular to the symmetry axis S is assumed to be L. At this time, the length D of the second side of the selected region 18A is assumed to be n/2 (n is an even number) wavelength of the antenna operating frequency.

Hereinafter, using FIG. 8, the phase of the electromagnetic waves radiated from the first sides (extending in Y-direction) of the selected region 18A parallel to the symmetry axis S will be described. As described in the fifth embodiment, when the phase of the electromagnetic waves radiated from one of the first sides is assumed to be α, the phase of the electromagnetic waves radiated from the other one of the first sides becomes opposite, i.e., α+180°. In the radio device according to the present embodiment, the length D of the second side is n/2 (n is an even number) wavelength of the operating frequency, so that the δ is an even multiple of 180°. Thus, the phase difference between the electromagnetic waves radiated respectively from the first sides is δ−180° in −X direction, i.e., an odd multiple of 180° and δ+180° in +X direction, i.e., an odd multiple of 180°, so that the electromagnetic waves radiated respectively from the first sides are opposite in phase and thus offset each other. That is, in the radio device according to the present embodiment, electromagnetic waves are not easily radiated in the ±X directions of FIG. 8. As a result, the directionality pattern can be set to the direction substantially parallel to the symmetry axis S.

Figure 12:
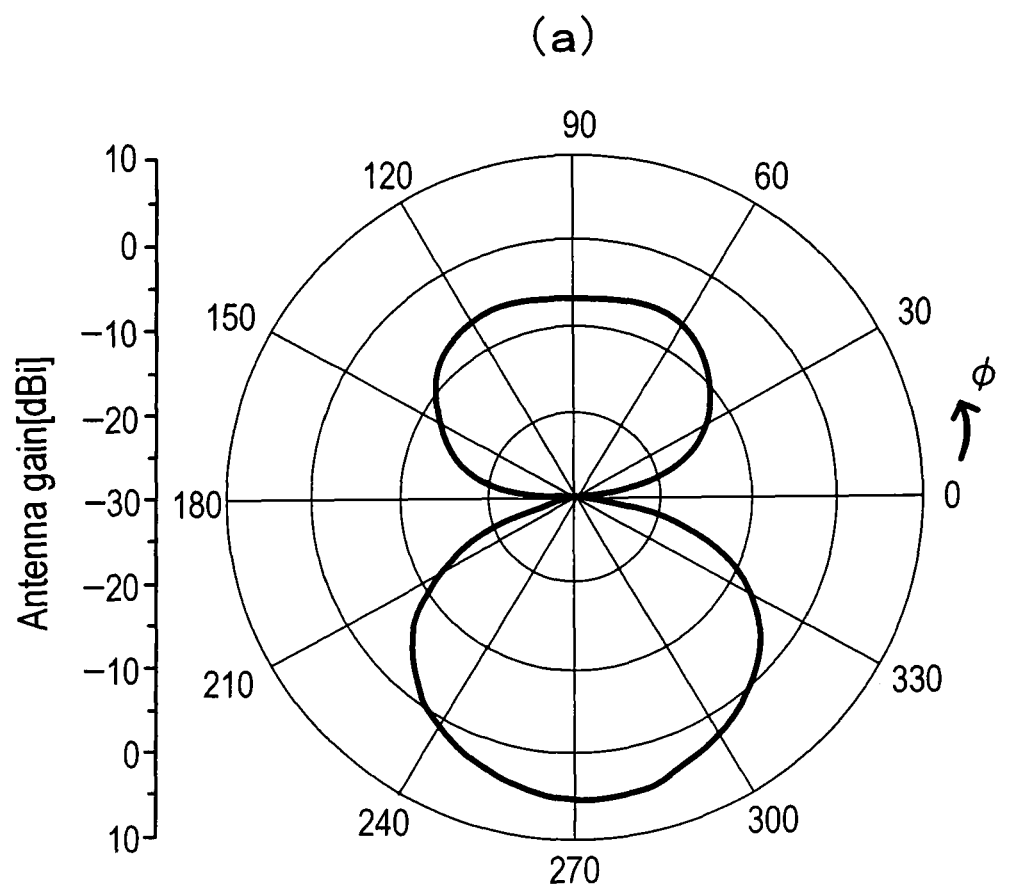
FIG. 12 is a view illustrating radiation pattern characteristics in a simplified model of FIG. 11A which are obtained by an electromagnetic field simulation.
Figure 12:
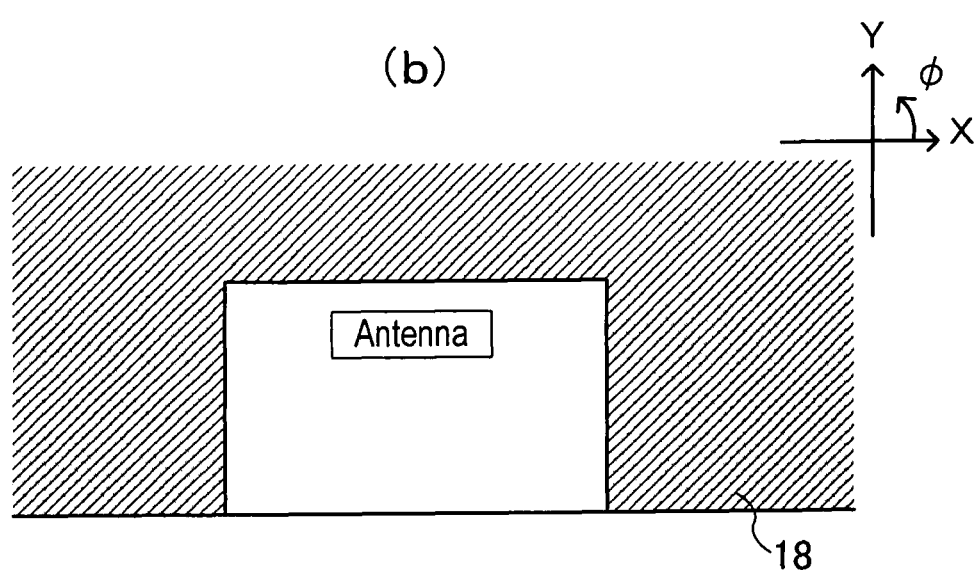

FIG. 12A illustrates a simulation result of a radiation pattern on the XY plane of the radio device of FIG. 11A in the case where the length D of the second side is set to substantially wavelength of the operating frequency. FIG. 12B is a simplified view illustrating the antenna 4 and the selected region 18A of the metal layer 18 of the mounting board 2 of the radio device illustrated in FIG. 11A. As is clear from a comparison between the radiation patterns of FIGS. 12 and 10, the radiation in FIG. 12 is weaker in the ±X direction.

According to the present embodiment, the same effect as in the first embodiment can be obtained. Further, by setting the length D of the second side of the selected region of the metal layer of the mounting board 2 to n/2 (n is an even number)

wavelength of the operating frequency, it is possible to strengthen the antenna radiation pattern in the direction parallel to the symmetry axis S.

Although the connection portions 11 opposite to the selected region 18A include the first connection portions 11A, third connection portions 11C adjacent to the first connection portions 11A, and connection portions 11 which are not adjacent to the first connection portions 11A in the present embodiment, a configuration may be adopted in which the connection portions opposite to the selected region 18A do not include the third connection portions 11C.

Seventh Embodiment

Figure 13:
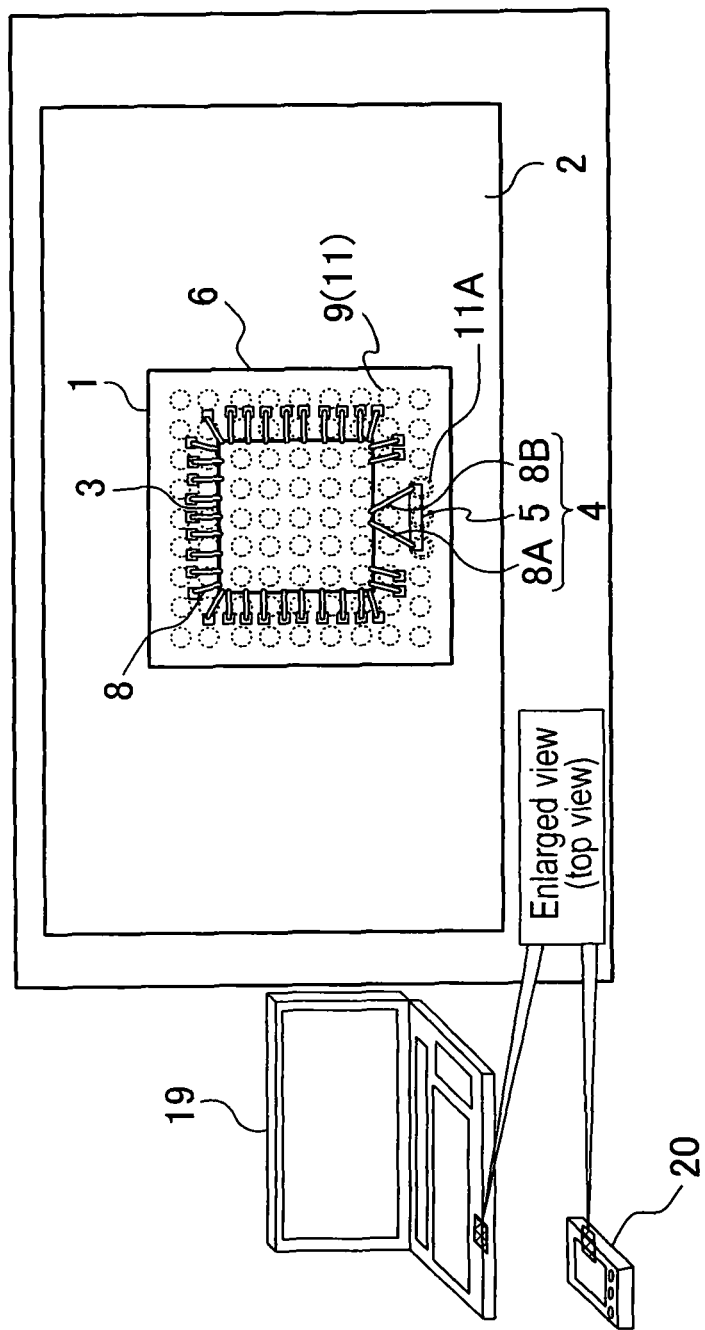
FIG. 13 is a view schematically illustrating a configuration of a radio communication apparatus that mounts therein the radio device according to the embodiment of the present invention.

Next, a radio communication apparatus according to a seventh embodiment will be described. FIG. 13 is a view schematically illustrating a configuration of a radio communication apparatus in which a radio device is mounted according to the seventh embodiment of the present invention.

The radio communication apparatus according to the seventh embodiment is an apparatus that mounts therein the radio device according to the first embodiment. The radio communication apparatus exchanges data, still or moving pictures, and the like with another device, etc., and is realized by, for example, a note PC 19 or a mobile terminal 20.

The note PC 19 or mobile terminal 20 has inside or outside thereof a radio device and performs communication using a frequency of, e.g., a millimeter band. The note PC 19 performs data communication with, e.g., the mobile terminal 20 through the radio device illustrated in FIG. 11. The note PC 19 may perform data communication with another device (not illustrated) that mounts the radio device of FIG. 11 through the radio device.

The radio device mounted in the note PC 19 and the radio device mounted in the mobile terminal 20 are disposed such that the directions in which the gains of antennas 4 are large, so that it is possible to exchange data effectively and with high quality.

Further, according to the embodiment described above, it is possible to improve antenna characteristics in the radio device that mounts the antenna inside the package as in the case of the first embodiment.

Although an example in which the radio device according to the sixth embodiment is mounted has been described in the present embodiment, the radio communication apparatus of the present invention may mount the radio device of any one of the first to fifth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A radio device comprising:
a mounting board having a conductive plane;
a semiconductor package mounted on the mounting board, the semiconductor package including an interposer having a conductive plane, a semiconductor chip mounted on a first surface of the interposer, and an antenna having a conductive element formed on the interposer, the antenna being electrically connected to the semiconductor chip;
a plurality of connection portions, each connection portion including a first pad formed on a second surface of the interposer, an external terminal connected to the first pad, and a second pad formed on the mounting board;
wherein the first pad, the external terminal, and the second pad are connected to each other; and
wherein a first electrical length of a first connection portion is less than ½ wavelength of a use frequency of the antenna, the first connection portion being a connection portion from among the plurality of connection portions which is located immediately adjacent to the conductive element and not being electrically connected to the conductive element.

2. A radio device comprising:
a mounting board having a conductive plane;
a semiconductor package mounted on the mounting board, the semiconductor package including an interposer having a conductive plane, a semiconductor chip mounted on a first surface of the interposer, and an antenna having a conductive element formed on the interposer, the antenna being electrically connected to the semiconductor chip;
a plurality of connection portions, each connection portion including a first pad formed on a second surface of the interposer, an external terminal connected to the first pad, and a second pad formed on the mounting board;
wherein the first pad, the external terminal, and the second pad are connected to each other; and
wherein a first electrical length of a first connection portion is less than ½ wavelength of a use frequency of the antenna, the first connection portion being a connection portion from among the plurality of connection portions which at least partially overlaps with the conductive element, and the first connection portion not being electrically connected to the conductive element.

3. The radio device according to claim 1, wherein:
a plurality of the first connection portions are provided;
at least one of the first connection portions is connected to a conductive plane other than the first and second pads; and
a second electrical length of the at least one of the first connection portions including the conductive plane is less than ½ wavelength of the use frequency of the antenna.

4. The radio device according to claim 2, wherein:
a plurality of the first connection portions are provided;
at least one of the first connection portions is connected to a conductive plane other than the first and second pads; and
a second electrical length of the at least one of the first connection portions including the conductive plane is less than ½ wavelength of the use frequency of the antenna.

5. The radio device according to claim 3, wherein a third electrical length of a second connection portion which is located nearest to the first connection portion from among the plurality of connection portions or a fourth electrical length of the second connection portion including the conductive plane of the mounting board or the interposer connected to the second connection portion is less than ½ wavelength of the use frequency.

6. The radio device according to claim 4, wherein a third electrical length of a second connection portion which is located nearest to the first connection portion from among the plurality of connection portions or a fourth electrical length of the second connection portion including the conductive plane of the mounting board or the interposer connected to the second connection portion is less than ½ wavelength of the use frequency.

7. The radio device according to claim 5, wherein the first to fourth electrical lengths are each less than ⅜ wavelength of the use frequency.

8. The radio device according to claim 6, wherein the first to fourth electrical lengths are each less than ⅜ wavelength of the use frequency.

9. The radio device according to claim 1, wherein the first connection portion is connected to a second connection portion through the conductive plane of the mounting board.

10. The radio device according to claim 2, wherein the first connection portion is connected to a second connection portion through the conductive plane of the mounting board.

11. The radio device according to claim 1, wherein the mounting board has a layered structure and has a layer in which no conductive plane other than the conductive plane connected to the first connection portion is formed in a region opposite to the conductive element.

12. The radio device according to claim 11, wherein the conductive element has a symmetric shape with respect to a symmetry axis, and the region has a symmetric shape with respect to the same symmetry axis.

13. The radio device according to claim 12, wherein an electrical length in a direction perpendicular to the symmetry axis of the region is an odd multiple of ½ wavelength of the use frequency.

14. The radio device according to claim 12, wherein an electrical length in a direction perpendicular to the symmetry axis of the region is an even multiple of ½ wavelength of the use frequency.

15. The radio device according to claim 2, wherein the mounting board has a layered structure and has a layer in which no conductive plane other than the conductive plane connected to the first connection portion is formed in a region opposite to the conductive element.

16. The radio device according to claim 15, wherein the conductive element has a symmetric shape with respect to a symmetry axis, and the region has a symmetric shape with respect to the same symmetry axis.

17. The radio device according to claim 16, wherein an electrical length in a direction perpendicular to the symmetry axis of the region is an odd multiple of ½ wavelength of the use frequency.

18. The radio device according to claim 16, wherein an electrical length in a direction perpendicular to the symmetry axis of the region is an even multiple of ½ wavelength of the use frequency.

19. The radio device according to claim 1, wherein the first electrical length of the first connection portion is a length of a longest one of paths of current flowing in the first connection portion.

20. The radio device according to claim 2, wherein the first electrical length of the first connection portion is a length of a longest one of paths of current flowing in the first connection portion.

21. A radio communication apparatus comprising the radio device according to claim 1.

22. A radio communication apparatus comprising the radio device according to claim 2.

* * * * *